(12) United States Patent
Kobayashi

(10) Patent No.: US 9,189,324 B2
(45) Date of Patent: Nov. 17, 2015

(54) DATA ARCHIVE SYSTEM, DATA RECORDING/REPRODUCING APPARATUS AND DATA LIBRARY APPARATUS

(71) Applicants:Hitachi Consumer Electronics Co., Ltd., Tokyo (JP); Hitachi-LG Data Storage, Inc., Tokyo (JP)

(72) Inventor: Masayuki Kobayashi, Kuki (JP)

(73) Assignees: Hitachi—LG Data Storage, Inc., Tokyo (JP); Hitachi Consumer Electronics Co., Ltd., Tokyo (JP)

( * ) Notice: Subject to any disclaimer, the term of this patent is extended or adjusted under 35 U.S.C. 154(b) by 191 days.

(21) Appl. No.: 13/853,317

(22) Filed: Mar. 29, 2013

(65) Prior Publication Data

US 2013/0290810 A1    Oct. 31, 2013

(30) Foreign Application Priority Data

Apr. 27, 2012    (JP) ................................ 2012-102030

(51) Int. Cl.
*H03M 13/00* (2006.01)
*G06F 11/10* (2006.01)
*G11B 20/18* (2006.01)

(52) U.S. Cl.
CPC ............ *G06F 11/10* (2013.01); *G11B 20/1803* (2013.01); *H03M 13/00* (2013.01)

(58) Field of Classification Search
CPC ..... H03M 13/15; H03M 13/27; H03M 13/29; H03M 13/151

USPC ................................................... 714/756, 785
See application file for complete search history.

(56) References Cited

U.S. PATENT DOCUMENTS

| | | | |
|---|---|---|---|
| 5,638,386 A * | 6/1997 | Tsunoda et al. | 714/769 |
| 6,282,688 B1 * | 8/2001 | Tsunoda et al. | 714/769 |
| 6,687,860 B1 * | 2/2004 | Iijima et al. | 714/718 |
| 7,085,205 B1 * | 8/2006 | Kinouchi | 369/47.12 |
| 7,188,299 B2 * | 3/2007 | Nakagawa et al. | 714/763 |
| 7,475,327 B2 * | 1/2009 | Suzuki et al. | 714/769 |
| 7,761,770 B2 * | 7/2010 | Larsen et al. | 714/758 |

FOREIGN PATENT DOCUMENTS

| | | |
|---|---|---|
| JP | 07-036632 A | 2/1995 |
| JP | 2010-218590 A | 9/2010 |

* cited by examiner

*Primary Examiner* — Esaw Abraham

(57) ABSTRACT

In a data recording and reproducing apparatus that includes a host computer and a drive in order to improve data reliability, in data recording, the host computer appends a first error correction code to the data and the drive appends a second error correction code to the data. When a failure has occurred in error correction performed by the drive using the second error correction code, the drive reads out the first error correction code and performs error correction using the first error correction code. Since error correction using the first error correction is possible even when error correction using the second error correction code ends in failure, the reliability of data is improved.

6 Claims, 6 Drawing Sheets

DATA ARCHIVE SYSTEM, DATA RECORDING/REPRODUCING APPARATUS AND DATA LIBRARY APPARATUS

INCORPORATION BY REFERENCE

This application relates to and claims priority from Japanese Patent Application No. 2012-102030 filed on Apr. 27, 2012, the entire disclosure of which is incorporated herein by reference

BACKGROUND OF THE INVENTION (1) Field of the Invention

The present invention relates to a data archive system, a data recording/reproducing apparatus and a data library apparatus.

(2) Description of the Related Art

As background art in the field of the present technology, there is disclosed Japanese Patent Application Laid-Open No. 2010-218590. There is a description in the above mentioned publication that since parity having the same structure as a usual data cluster is additionally appended and an appended position is indicated by the same format as that in defect management, reliability of data can be improved while maintaining high compatibility with a conventional device. In addition, there is also disclosed Japanese Patent Application Laid-Open No. H7 (1995)-36632. There is a description in the above mentioned publication that the present invention can avoid that a restoring operation is not performed on a new blank optical disk and long lasting useless processing is performed in case of a malfunction of the drive itself under the management of a storing system which is redundant among optical discs to be loaded on a plurality of drives and hence a restoration time in case of the malfunction of the drive itself can be reduced.

SUMMARY OF THE INVENTION

Such a mechanism that in a recording and reproducing device for an optical disc on which it is recorded in a format that reliability is ensured by appending the parity on a cluster-by-cluster basis, the parity can be added while maintaining the format of the cluster, and improvement of reliability can be promoted by few addition to a device performing recording and reproduction in accordance with a format that the reliability is ensured by appending the parity on the conventional cluster-by-cluster basis is described in Japanese Patent Application Laid-Open No. 2010-218590. However, addition of circuits to the recording and reproducing device is unavoidable in order to promote the improvement of reliability.

In addition, such a mechanism that in an object for recording data and error correction data on discs to be loaded on the plurality of drives by providing redundancy, a drive for restoration is prepared, when an error has occurred in one of the above-mentioned five drives, the disc loaded on that drive is loaded on the drive for restoration to determine whether the disc is abnormal, when the disc is not abnormal, the drive for restoration is used in place of the drive in which the error has occurred, while when the disc is abnormal, a blank disc is loaded on the drive for restoration, data is generated by exclusive ORing data from discs which are loaded on the drives other than the drive in which the error has occurred, and the data is stored in the blank disc by the drive for restoration, whereby restoration is performed is described in Japanese Patent Application Laid-Open No. H7 (1995)-36632. However, a plurality of discs and a new drive controller are desired in error correction in order to promote reliability improvement.

Therefore, the present invention aims to provide a data recording and reproducing apparatus which allows error correction by a single disk without adding a new circuit and a new drive controller.

In order to solve the above-mentioned subject matter, configurations described, for example, in WHAT IS CLAIMED IS are adopted. Although the present invention includes a plurality of devices or sections for solving the above-mentioned subject matter, it features the matter according to claim 1 as one example thereof.

According to the present invention, improvement of data reliability is allowed.

Subject matters, configurations and effects other than the above will be apparent from the following description of preferred embodiments.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

Hereinafter, embodiments of the present invention will be described with reference to the accompanying drawings.

First Embodiment

Figure 1:
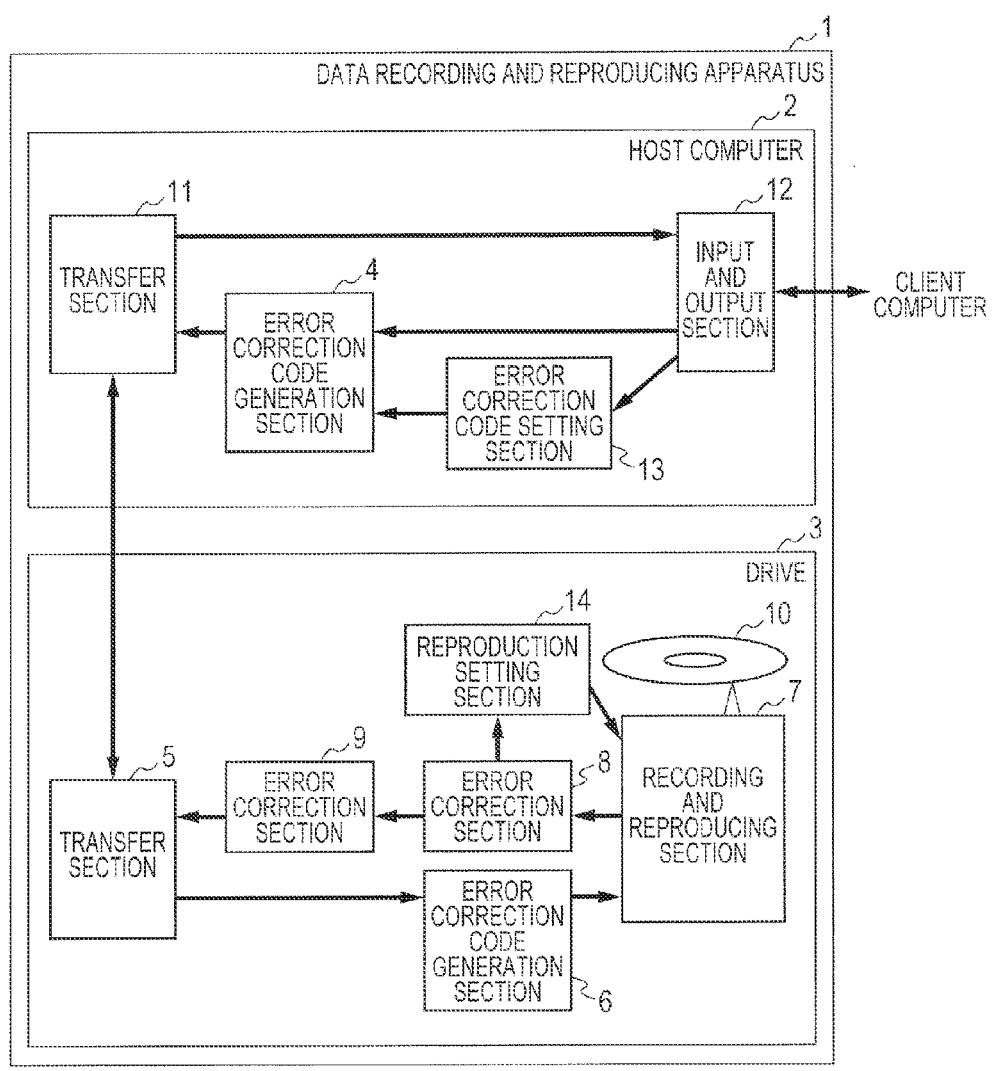
FIG. 1 is a block diagram illustrating an example of a configuration of a data recording and reproducing apparatus according to a first embodiment.

FIG. 1 is a block diagram illustrating an example of a configuration of a data recording and reproducing apparatus 1 according to a first embodiment of the present invention. The data recording and reproducing apparatus 1 includes a host computer 2 and a drive 3, records data input from a client computer on a recording medium (for example, an optical disc 10) within the drive 3 and outputs data reproduced from the optical disk 10 within the drive 3 to the client computer.

The host computer 2 inputs and outputs data into and from the client computer and perform data transfer between it and the drive 3. The host computer 2 is a computer on which, for example, LINUX (a registered trademark) operates as an OS (Operating System).

The drive 3 records the data received from the host computer 2 on the optical disc 10 and transmits the data reproduced from the optical disc 10 to the host computer 2.

A first error correction code generation section 4 generates a first error correction code. The first error correction code generation section 4 is implemented by software processing which operates on, for example, the host computer 2.

A data transfer section 5 is included in the drive 3 and transfers data to a transfer section 11. The transfer section 5 is, for example, a SATA (Serial Advanced Technology Attachment) interface and is implemented by a circuit within an LSI (Large Scale Integration) that the drive 3 includes.

A second error correction code generation section 6 generates a second error correction code. The second error correction code generation section 6 is implemented by, for example, a circuit within the LSI that the drive 3 includes.

A recording and reproducing section 7 records data on the optical disc 10 and reproduces data from the optical disk 10.

A second error correction section 8 performs error correction using a second error correction code. The second error correction section 8 is implemented by, for example, a circuit within the LSI that the drive 3 includes.

A first error correction section 9 performs error correction using a first error correction code. The first error correction section 9 is implemented by, for example, software processing which operates on a CPU of the LSI that the drive 3 includes.

The data recording medium 10 is, for example, a BD-R (Blu-ray Disc (R) Recordable). Incidentally, in the following description, the data recording medium will be described as the optical disc 10. However, the data recording medium is not necessarily limited to the optical disc and may be a recording medium such as a magneto-optical disc, a hologram disk or the like.

The data transfer section 11 is included within the host computer 2 and performs data transfer relative to the data transfer section 5. The transfer section 11 is, for example, a SATA (Serial ATA) interface and is implemented by a circuit within the LSI that the host computer 2 includes.

A data input and output section 12 inputs data sent from the client computer into the host computer and outputs data received from the host computer to the client computer. The input and output section 12 is, for example, an ETHERNET (R) interface and is implemented by a circuit within the LSI that the host computer 2 includes.

A first error correction code setting section 13 receives address information of data which has been input via the input and output section 12 and inputs setting information into the first error correction code generation section 4 to set the first error correction code. The first error correction code setting section 13 calculates a radial position where the data is recorded on the optical disc 10 from the address information. Then, the first error correction code setting section 13 sets the first error correction code such that a ratio of the data capacity of the first error correction code to user data is increased as the radial position shifts from an inner periphery toward an outer periphery. For example, the first error correction code is set such that the ratio would be 8% at the radial position on the innermost periphery side and the ratio would be 10% at the radial position on the outermost periphery side by incrementally changing the ratio as the radial position shifts toward the outer periphery. As a result, it is allowed to record a minimum data capacity of the first error correction code on the optical disc whose error rate is increased as the radial position shifts toward the outer periphery, thereby ensuring the data reliability and the life of the optical disc 10. The above-mentioned code setting is effective particularly in a data library apparatus in which the outer periphery of the disc is liable to be damaged when the disc is carried.

In the above-mentioned example, the ratio is set to be increased as the radial position shifts toward the outer periphery. On the other hand, in case of an optical disc whose error rate is increased as the radial position shifts toward the inner periphery, the first error correction code setting section 13 sets the first error correction code such that the ratio is increased as the radial position shifts toward the inner periphery.

In addition, the first error correction code setting section 13 may include a section for acquiring operation start date and time and current date and time of the data recording and reproducing apparatus 1 and may set the first error correction code such that the ratio is reduced as days and hours pass, instead of setting to increase the ratio as the radial position shifts toward the outer periphery. For example, the first error correction code may be set such that the ratio would be 10% within one year counted from the operation start date, the ratio would be decreased by 1% every time one year passes counted from the operation start date, and the ratio would be 2% in the 9-th year. As a result, it is allowed to record a minimum data capacity of the first error correction code on an optical disc whose error rate is increased as it degrades with time after data recording, thereby ensuring data reliability.

In the above-mentioned example, the first error correction code is set to increase the ratio as the radial position shifts toward the outer periphery or the inner periphery, or to decrease the ratio is set to be decreased as days and hours pass. Alternatively, both may be performed simultaneously.

In addition, the ratio of a place where management information is to be recorded may be set higher than the ratios of other places irrespective of the radial position and the operation start date of the disc concerned. The management information is, for example, metadata of a filing system. It is allowed to preferentially ensure data reliability of information which would become desirable before reading out data stored on other places by setting the ratio of the place where the management information is to be recorded higher than those of other places.

A reproduction setting section 14 receives address information which has failed in error correction from the second error correction section 8 and sets conditions for reproduction on the recording and reproducing section 7.

Figure 2:
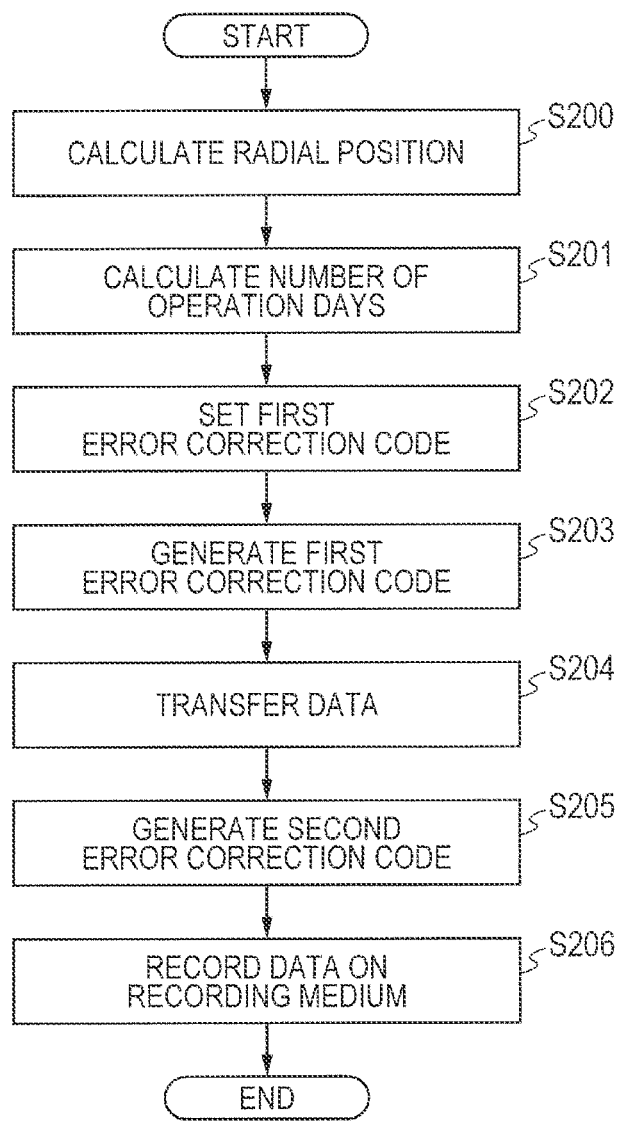
FIG. 2 is a flowchart illustrating an example of procedures of a data recording process of the first embodiment.

Next, the operation of the data recording and reproducing apparatus 1 performed when data is to be recorded on the optical disc 10 will be described. FIG. 2 is a flowchart illustrating an example of recording procedures of the data recording and reproducing apparatus 1 according to the first embodiment.

First, in step S200, the first error correction code setting section 13 acquires address information of input data from the input and output section 12 to calculate a radial position where the data is to be recorded on the optical disc 10.

Next, in step S201, the first error correction code setting section 13 calculates the number of operation days of the data recording and reproducing apparatus 1 from the operation start date and time and the current date and time.

Next, in step S202, the first error correction code setting section 13 inputs setting information into the first error correction code generation section 4 and sets the first error correction code.

Next, in step S203, the first error correction code is generated by the first error correction code generation section 4 from data which has been input into the host computer 2 via the input and output unit 12. In the BD-R, the input data is gathered by the amount of 62 MB (here 1 MB means 1024 KB) in units of 64 KB (here 1 KB means 1024 bytes) and is arranged in a matrix of 31 rows×32 columns, and the first error correction code of a 64 KB byte Hamming code is appended to the data for every 64 KB×31 bytes so as to form a configuration of 32 rows×32 columns. This configuration is called a band of a first error correction sequence. Correction of the band up to 64 KB is allowed by using position information which has been detected with the later described second error correction code.

Next, in step S204, the transfer section 5 in the drive 3 receives received data formed by adding the first error correction code to the input data from the transfer section 11 in the host computer 2.

Next, in step S205, the second error correction code generation section 6 receives the received data from the transfer section 5 and generates the second error correction code from the received data. In the BD-R, after the received data has been divided into 2048-byte sectors, a 4-byte error detection code is appended to each sector, and 32 sectors are gathered and are arranged in a matrix of 216 rows×304 columns, and then the second error correction code of a 32-byte Reed Solomon code is appended for every 216 bytes so as to form a configuration of 248 rows×304 columns. This configuration is called a cluster of the second error correction sequence, and erasure correction of 248-byte data of each column of the cluster up to 32 bytes is allowed with position information indicated by BIS (Burst Indicator Subcode).

Next, in step S206, the recording and reproducing section 7 records recorded data formed by adding the second error correction code to the received data on the optical disc 10.

Although in the foregoing example, the band is configured by gathering data in units of 64 KB, the data unit is not limited to 64 KB and the band may be configured by gathering data in a unit equivalent to integral multiples of the data capacity of the cluster.

Also, although in the foregoing example, the first error correction code is generated by gathering data of the capacity corresponding to 62 MB, the capacity is not limited to 62 MB and the first error correction code may be generated by gathering data of the capacity equivalent to integral multiples of the data capacity so defined as the unit.

In addition, although in the foregoing example, the band has the configuration of 32 rows×32 columns, the band is not limited to the combination of 32 rows and 32 columns and it may have a configuration of, for example, 64 rows×128 columns and the data size of the band when it has the configuration of 64 rows×128 columns may be not more than 512 MB, that is, may be of the unit equivalent to integral multiples of the cluster size. When the data size of the band is smaller than 512 MB, a shortage of data in the matrix of 63 rows×128 columns when the first error correction code is to be generated may be padded with specific fixed data.

Figure 3:
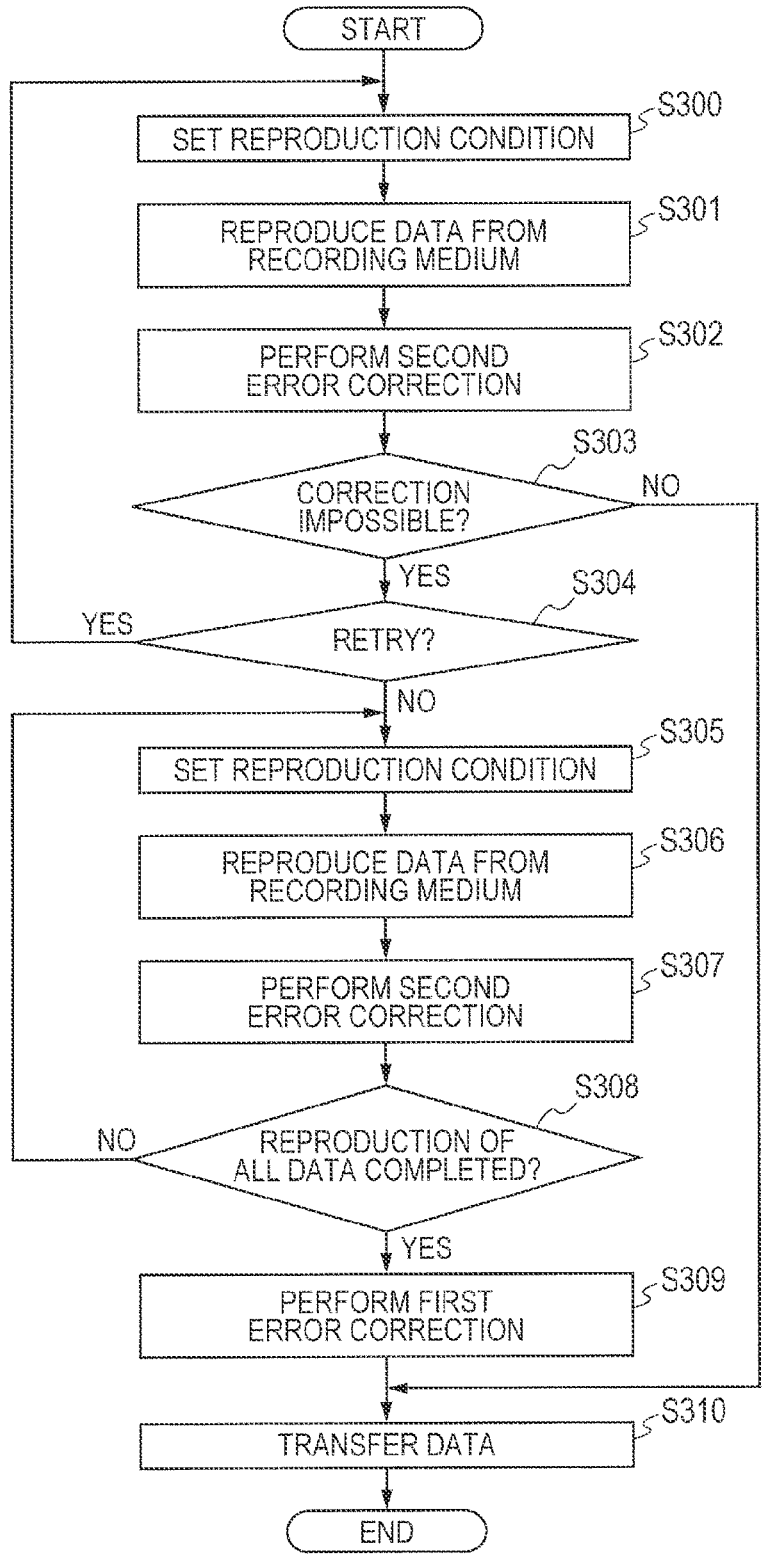
FIG. 3 is a flowchart illustrating an example of procedures of a data reproducing process of the first embodiment.

Next, the operation of the data recording and reproducing apparatus 1 performed when data is to be reproduced from the optical disc 10 will be described. FIG. 3 is a flowchart illustrating an example of procedures of reproducing the data from the optical disc 10 on which the data has been recorded in the procedures in FIG. 2.

First, in step S300, the reproduction setting section 14 sets a reproduction condition in the recording and reproducing section 7.

Next, in step S301, the recording and reproducing section 7 reproduces the data from the optical disc 10.

Next, in step S302, the second error correction section 8 corrects an error in the reproduced data. In the BD-R, the second error correction section 8 repeatedly executes in order operations of dividing the reproduced data into 64-KB clusters, arranging the clusters in a matrix of 248 rows×304 columns, obtaining position information indicated by BIS, and correcting errors in units of 248 byte 304 times to correct the errors in all pieces of data of the clusters. Erasure correction up to 32 bytes of 248-byte data of each column of the cluster is allowed with the position information indicated by the BIS.

Next, in step 303, whether correction is impossible is determined. When correction is impossible, the process proceeds to step S304. While when correction is possible, the process proceeds to step S310.

Next, in step S304, whether reproduction is to be retired is determined. When it is to be retried, the process proceeds to step S300. While when it is not retried, the process proceeds to step S305. The determination is made depending on whether retry reaches a previously defined upper limit on the number of times. The upper limit on the number of times is defined to have different values between a case that the address of the optical disc on which the first error correction code has been recorded is to be reproduced and a case that the address is not reproduced. In the case that the address of the optical disc on which the first error correction code has been recorded is to be reproduced, the number of times is set to a value lower than that in the case that the address is not reproduced. Thus, improvement of data reliability is allowed by retrying the reproduction many times when first error correction is not made.

Next, in step S305, the reproduction condition is set. The reproduction condition to be set in step S305 is the reproduction condition which has been set in the first step S300 of the reproduction flow.

Next, in step S306, the recording and reproducing section 7 reproduces data of the band to which the reproduced data belongs in order. In the BD-R, the data in the band is reproduced in order in units of 64 KB. The reproduction condition in this step is the reproduction condition which has been lastly set in step S300.

Next, in step S307, the second error correction section 8 corrects an error in the data reproduced in step S305 as in step S302.

Next, in step S308, whether reproduction of all pieces of data of the band is completed is determined. When it is completed, the process proceeds to step S309, while when it is not yet completed, the operations in steps S305, S306 and S307 are again executed. In the BD-R, the all data capacity of the band is 2 MB, and the operations in steps S303 and S307 are repeated 31 times to reproduce all pieces of data of the band other than the data reproduced in step S302.

Next, in step S309, the first error correction section 9 restores data error correction of which has ended in failure in step S302 from the data reproduced in steps S306 and S307. In the BD-R, the data error correction of which has ended in failure in step S302 is restored from 31×64-KB data reproduced in steps S306 and 307.

Next, in step S310, the transfer section 5 in the drive transfers the restored data to the transfer section 11 in the host computer 2 and the input and output section 12 of the host computer 2 outputs the data to the client computer.

Owing to the above procedures, it becomes possible to restore data by first error correction even when second error correction has ended in failure.

Although in the foregoing example, the first error correction is performed in step S309 after all pieces of data of the band have been reproduced in steps S306, S307 and S308, the order is not limited to the above. The data may be restored by the procedure that the order of steps S309 and S308 is changed, for example, by obtaining data error position information from the second error correction by using a simple error detection code as the first error correction code and dividing arithmetic operation of the first error detection in step S309 per piece of data of the band. Adoption of the above-mentioned procedure allows elimination of storage of all pieces of data of the band in a memory and implementation of the first error correction section by a small capacity memory.

Second Embodiment

Figure 4:
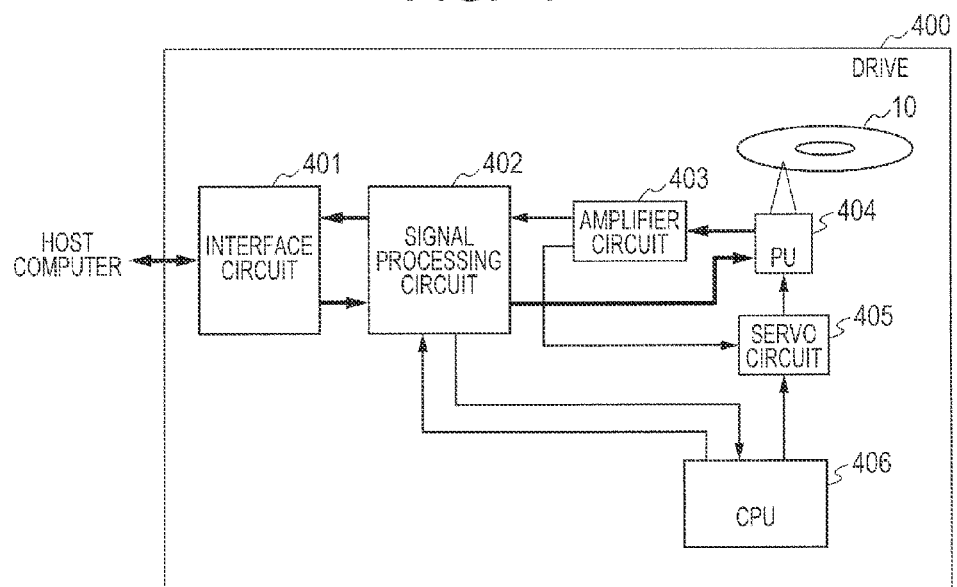
FIG. 4 is a block diagram illustrating an example of a configuration of a drive according to a second embodiment.

FIG. 4 is a block diagram illustrating an example of a configuration of a drive 400 of a data recording and reproducing apparatus according to a second embodiment of the present invention. The data recording and reproducing apparatus according to the second embodiment is configured by replacing the drive 3 in the configuration illustrated in FIG. 1 with the drive 400.

An optical pick-up 404 is controlled by a servo circuit 405 to read a signal out of the optical disc 10, to send it to an amplifier circuit 403 and to record a modulated signal sent from a signal processing circuit 402 on the optical disc 10.

The amplifier circuit 403 amplifies a reproduction signal read out of the optical disc 10 via the optical pick-up 404 and sends the amplified signal to the signal processing circuit 402. In addition, the amplifier circuit 403 generates a servo signal and sends the generated servo signal to the servo circuit 405. The amplifier circuit 403 is implemented by, for example, an AFE (Analog Front End).

The signal processing circuit 402 demodulates an input signal and sends data thereof which has been de-interleaved, subjected to error correction and descrambled to an interface circuit 401. In addition, the signal processing circuit 402 scrambles data sent from the interface circuit 401, appends an error correction code to the data, interleaves and modulates the data and then sends the data to the optical pick-up 404.

The interface circuit 401 sends data sent from the signal processing circuit 402 to the host computer 2, and sends data sent from the host computer 2 to the signal processing circuit 402. The interface circuit 401 performs data transfer conforming to, for example, SATA and other transfer systems.

A CPU (Central Processing Unit) 406 controls recording and reproducing processes of the drive 400. Incidentally, an arbitrary control circuit, or an exclusive use circuit such as an ASIC (Application Specific Integrated Circuit) may be used in place of the CPU.

A servo circuit 405 controls the optical pick-up 404 with a servo signal generated by the amplifier circuit 403 and in accordance with instructions from the CPU 406.

Next, the operation of the drive 400 performed when data is to be recorded on the optical disc 10 will be described. When the optical disc 10 is loaded on the drive 400, the CPU 406 sets the optical disc 10 up via the optical pick-up 404, the amplifier circuit 403 and the servo circuit 405.

Then, when data is sent from the host computer 2 to the drive 400, the data is received by the interface circuit 401, is scrambled, appended with an error correction code and interleaved and demodulated by the signal processing circuit 402, is sent to the optical pick-up 404 and is recorded on the optical disc 10. The error correction code which is appended by the signal processing circuit 402 is a second error correction code which is generated in a second error correction sequence.

Next, the operation of the drive 400 performed when data is to be reproduced from the optical disc 10 will be described. When the optical disc 10 is loaded on the drive 400, the CPU 406 sets the optical disc 10 up via the optical pick-up 404, the amplifier circuit 403 and the servo circuit 405.

Then, when data is requested from the host computer 2 to the drive 400, a signal which has been read out of the optical disc 10 via the optical pick-up 404 is amplified by the amplifier circuit 403, and the data thereof is demodulated, de-interleaved, subjected to error correction and de-scrambled by the signal processing circuit 402, and is sent to the host computer 2 via the interface circuit 401. Error correction codes used when error correction is performed by the signal processing circuit 402 are a first error correction code generated in a first error correction sequence and the second error correction code generated in the second error correction sequence. First, error correction is performed with the second error correction code, and when a failure has occurred in correction, error correction is performed with the first error correction code.

Figure 5:
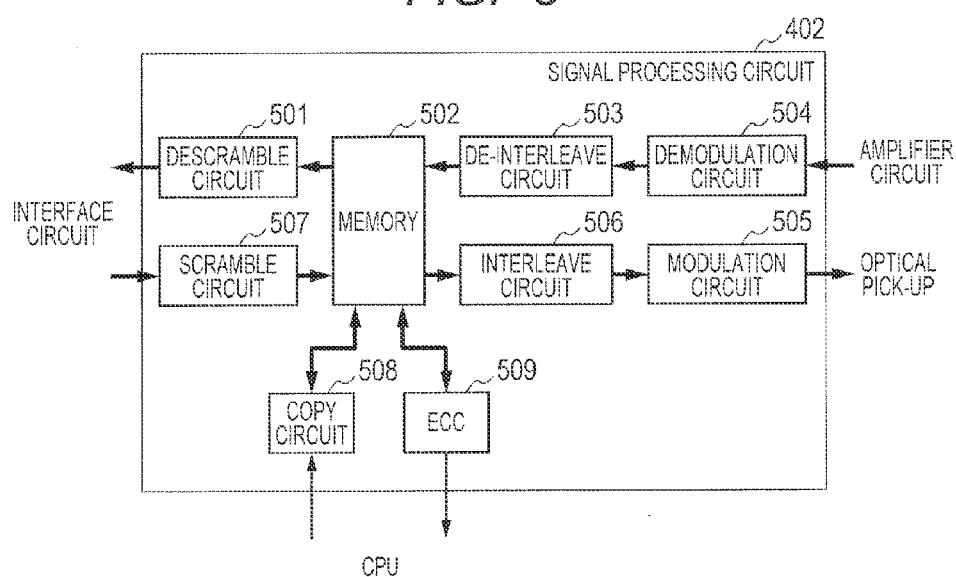
FIG. 5 is a block diagram illustrating an example of a signal processing circuit according to the second embodiment.

FIG. 5 is a block diagram illustrating an example of a configuration of the signal processing circuit 402. The signal processing circuit 402 demodulates an input signal which has been sent from the amplifier circuit and sends the data thereof which has been de-interleaved, subjected to error correction and descrambled to the interface circuit 401. In addition, the signal processing circuit 402 scrambles data sent from the interface circuit 401, appends an error correction code to the data, interleaves and demodulates the data and sends the data to the optical pick-up 404.

A demodulation circuit 504 performs 1-7 PP demodulation on an input signal and sends it to a de-interleave circuit 503. The de-interleave circuit 503 de-interleaves the data sent from the demodulation circuit 504 and writes it into a memory 502. The memory 502 is used as a memory for error correction, a memory for error code appending and a buffer memory. The memory 502 is implemented by, for example, a DRAM (Dynamic Random Access Memory), an SRAM (Static Random Access Memory) or the like.

An error correction and error correction code appending circuit 509 reads data out of the memory 502, corrects an error in the data, writes the data into the memory 502, and when a failure has occurred in correction, informs the CPU 406 of the failure. In addition, the error correction and error correction code appending circuit 509 reads data out of the memory 502, generates an error correction code and writes it into the memory 502.

A de-scramble circuit 501 de-scrambles data error correction of which has been completed and sends the de-scrambled data to the interface circuit 401.

A scramble circuit 507 scrambles data sent from the interface circuit 401 and writes the scrambled data into the memory 502.

An interleave circuit 506 interleaves the data read out of the memory 502 and sends the interleaved data to the modulation circuit 505.

The modulation circuit 505 performs 1-7 PP modulation on the data sent from the interleave circuit 506 and sends the data to the optical pick-up 404.

A data copy circuit 508 copies the data in the memory 502 in accordance with instructions from the CPU 406 and pastes the copied data to another region in the memory 502. Thus, it becomes possible to copy data in certain regions in the memory 502 in certain order and to paste the data to other regions in the memory 302 by rearranging the data in another order. It becomes possible to perform the second error correction by, for example, loading the second error correction sequence into the memory 502 and processing it by software on the CPU 406.

Next, the operation of the signal processing circuit 402 performed on data sent from the interface circuit 401 when the data is to be recorded on the optical disc concerned will be described. The data sent from the interface circuit 401 is scrambled by the scramble circuit 507 and is written into the memory 502.

Then, an error correction code is appended to the data written into the memory 502 by the error correction and error correction code appending circuit 509. The error correction code to be appended is the second error correction code generated in the second error correction sequence.

Then, the data is interleaved by the interleave circuit 506, is subjected to 1-7PP modulation by the modulation circuit 505 and is sent to the optical pick-up 404.

Next, the operation of the signal processing circuit 402 performed on an input signal from the amplifier circuit 403 when data is to be reproduced from the optical disc concerned will be described. The input signal from the amplifier circuit 403 is subjected to data demodulation by the demodulation circuit 504, is de-interleaved by the de-interleave circuit 503 and is written into the memory 502.

Then, an error in the data written into the memory 502 is corrected by the error correction and error correction code appending circuit 509. First, the data is read out of the memory 502 in the second error correction sequence and an error in the data is corrected with the second error correction code. When a failure does not occur in correction, the data is de-scrambled by the descramble circuit 501 and is sent to the interface circuit 401.

When a failure has occurred in correction, the failure is informed of to the CPU 406, the data copy circuit 508 sequentially rearranges the data to be read out of the memory 502 in the first error correction sequence, reads the data out of the memory in the second error correction sequence and corrects the error in the data by software processing which operates on the CPU 406 in accordance with instructions from the CPU 406. Next, the error corrected data is copied by the data copy circuit 508 and is pasted to its original data position. Then, the data is de-scrambled by the de-scramble circuit 501 and is sent to the interface circuit 401.

Owing to the foregoing operations, when it is difficult to perform the second error correction, restoration of the data is allowed by the first error correction in the drive 400 which is configured differently from the drive 3 in the first embodiment in the same manner as that in the first embodiment.

Third Embodiment

A data recording and reproducing apparatus according to a third embodiment of the present invention includes a data library apparatus 601, a server 603 for generating error correction codes for user data and a drive 610 for performing error correction using the above-mentioned codes. Generation of the error correction codes and error correction are performed in the same manner as that in the first embodiment.

Figure 6:
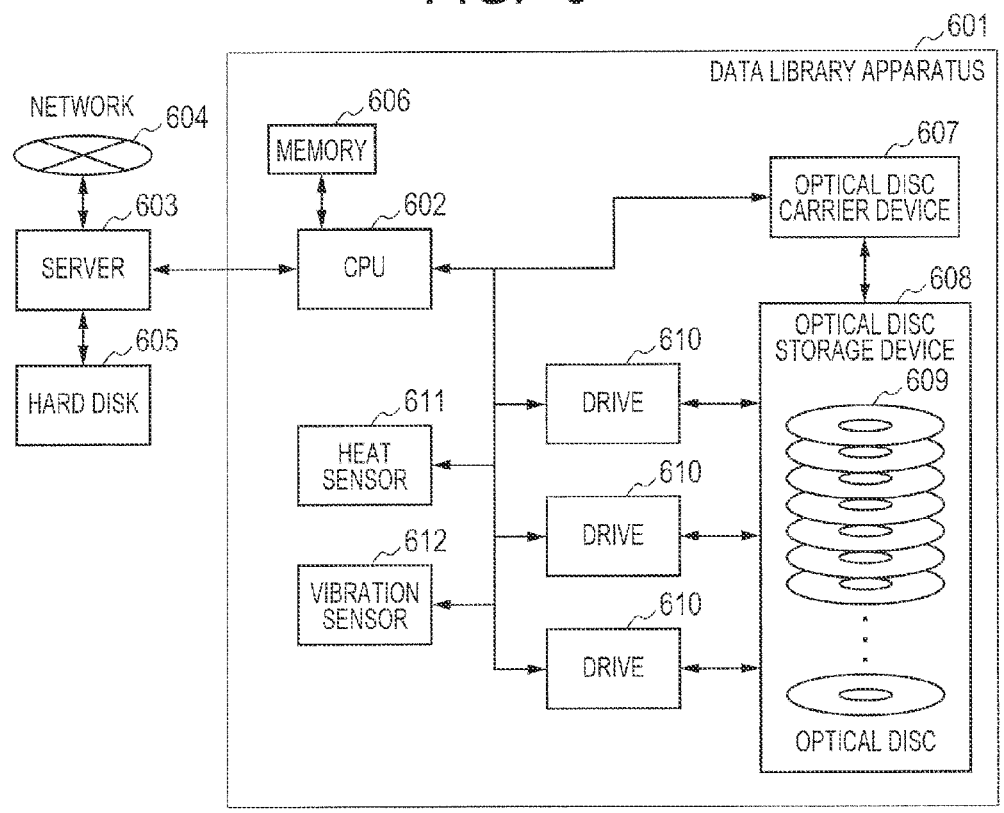
FIG. 6 is a block diagram illustrating an example of a configuration of a data library apparatus according to a third embodiment.

FIG. 6 is a block diagram illustrating an example of a configuration of the data library apparatus 601 according to the third embodiment. The data library apparatus 601 includes a CPU 602, a memory 606, an optical disc carrier device 607, an optical disc storage device 608, optical discs 609, the plurality of drives 610, a heat sensor 611 and a vibration sensor 612.

Although in the foregoing example, the data library apparatus 601 includes the heat sensor 611 and the vibration sensor 812, the above-mentioned sensors may be eliminated from the configuration when temperature change and vibration do not hinder the operation of the data library apparatus 601.

The data library apparatus 601 is connected with a network 604 via the server 603 which is connected with a hard disk 605, receives a data storage command, the user data, error correction code data and error correction code setting information from the server 603 and records the above-mentioned data and setting information on the optical disc concerned 609.

In addition, the data library apparatus 601 receives a data fetch command from the server 603, reproduces the user data from the optical disc 609 and transmits the reproduced user data to the server 608.

The CPU 602 is connected with the server 603, the memory 606, the optical disc carrier device 607, the plurality of drives 610, the heat sensor 611 and the vibration sensor 612, executes a control program for controlling the data library apparatus 601, receives a data storage command from the server 603, makes the optical disc carrier device 607 carry an arbitrary optical disc 609 from the optical disc storage device 608 to an arbitrary drive 610, receives the user data, the error correction code data and the error correction code setting information from the server 603, transmits a record command, the user data, the error correction code data and the error correction code setting information to the drive 610 and makes the drive 610 record the data and the error correction code setting information on the optical disc 609.

In addition, the CPU 602 receives the data fetch command from the server 603, makes the optical disc carrier device 607 carry an arbitrary optical disc 609 from the optical disc storage device 608 to an arbitrary drive 610, transmits a reproduction command to the drive 610 to reproduce error correction code setting information, thereafter transmits an error correction setting command and the error correction code setting information to the drive 610 to make the drive 610 reproduce the user data stored in the optical disc 609, receives the reproduced data from the drive 610 and transmits the received data to the server 603.

The server 603 receives the user data from the network 604 and makes the hard disk 605 store the user data.

In addition, the server 603 transmits a storage command, the above-mentioned data and error correction code data to the data library apparatus 601 to make the data library apparatus 601 store them and deletes the user data ever stored in the hard disk 605.

Further, the server 603 receives the data fetch command from the network 604, fetches the user data from the hard disk 605 and transmits the fetched user data to the network 604.

Still further, the server 603 receives the data fetch command from the network 604, transmits the data fetch command to the data library apparatus 601, receives the user data from the data library apparatus 601 and transmits the received user data to the network 604.

The network 604 is connected with the server 603 to propagate the data storage command and the user data to the server 603.

In addition, the network 604 propagates the data fetch command and the user data from the server 603.

The hard disk 605 is connected with the server 603, receives the user data from the server 603 and stores the received user data therein.

In addition, the hard disk 605 receives the data fetch command from the server 603 and transmits designated user data to the server 603.

Further, the hard disk 605 receives a data delete command from the server 603 and deletes the designated user data.

The memory 606 is connected with the CPU 602 and stores data on a control program of the data library apparatus 601, the user data, the error correction code data and the error correction code setting information received from the server 603 and the user data and the error correction code setting information received from the drive 610.

The optical disc carrier device 607 is connected with the CPU 602, the optical disc storage device 608, the plurality of drives 610, the heat sensor 611 and the vibration sensor 612, receives an optical disc carry command from the CPU 602, takes out a designated optical disc 609 from the optical disc storage device 608 and inserts the optical disc 609 into a designated drive 610.

In addition, the optical disc carrier device 607 receives the carry command from the CPU 602, transmits an eject command to the designated drive 610, takes out the optical disc 609 loaded on the drive 610 and inserts the optical disc 609 into a designated position in the optical disc storage device 608.

Although in the foregoing example, the eject command is transmitted from the optical disc carrier device 607 to the drive 610, the eject command may be transmitted from the CPU 602 in place of the optical disc carrier device 607.

The optical disc storage device 608 includes slots which hold the plurality of optical discs 609 and stores the plurality of optical discs 609.

The plurality of optical discs 609 are stored in the optical disc storage device 608 and the user data, the error correction code data and the error correction code setting information are recorded on an arbitrary optical disc 609 and reproduced from the optical discs 609 by an arbitrary drive 610.

The drive 610 is connected with the CPU 602 and the optical disc carrier device 607, receives a record command, the user data, the error correction code data and the error correction code setting information from the CPU 602 in a state that the optical disc 609 which has been taken out from the optical disc carrier device 607 is being inserted, and records the above-mentioned data on the optical disc 609.

In addition, the drive 610 receives a reproduction command from the CPU 602 in a state that the optical disc 609 which has been taken out from the optical disc carrier device 607 is being inserted, reproduces data from the optical disc 609 and transmits the reproduced data to the CPU 602.

Further, the drive 610 receives an error correction setting command and the error correction code setting information from the CPU 602 to be set for error correction.

Still further, the drive 610 receives the eject command from the optical disc carrier device 607, takes out the optical disc 609 and delivers the taken out optical disc 609 to the optical disc carrier device 607.

The heat sensor 611 is connected with the CPU 602 and the optical disc carrier device 607, receives a temperature information acquiring command from the CPU 602 or the optical disc carrier device 607 and transmits temperature information to the CPU 602 or the optical disc carrier device 607.

The vibration sensor 612 is connected with the CPU 602 and the optical disc carrier device 607, receives a vibration information acquiring command from the CPU 602 or the optical disc carrier device 607 and transmits vibration information to the CPU 602 or the optical disc carrier device 607.

Figure 7:
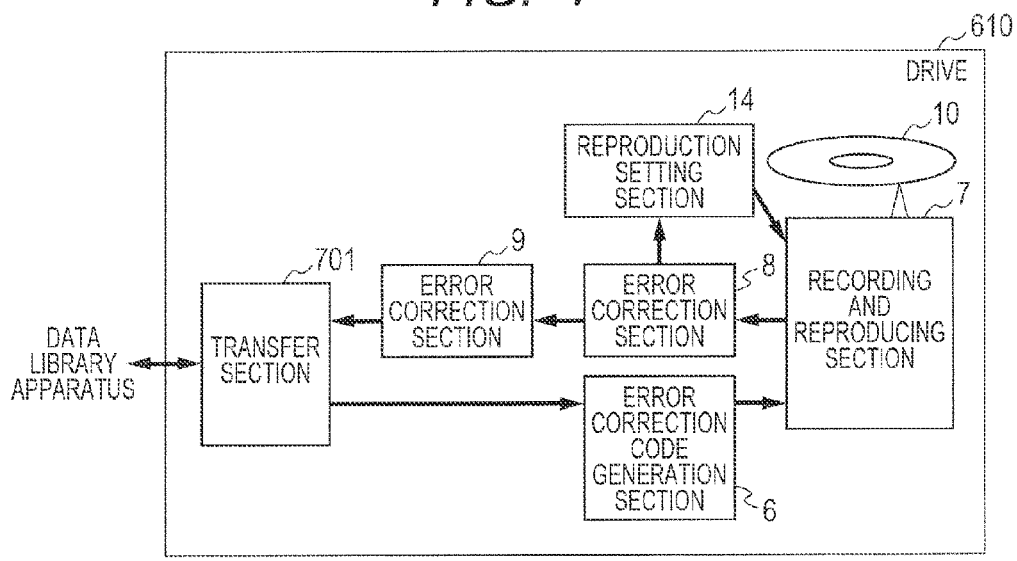
FIG. 7 is a block diagram illustrating an example of a configuration of a drive according to the third embodiment.

FIG. 7 is a block diagram illustrating an example of a configuration of the drive 610 according to the third embodiment. A transfer section 701 transfers the record command, the reproduction command and data concerned to the data library apparatus 601. When the reproduction command is to be transferred, the transfer section 701 transfers the error correction code setting information together with the reproduction command to make the error correction section 9 perform error correction.

Figure 8:
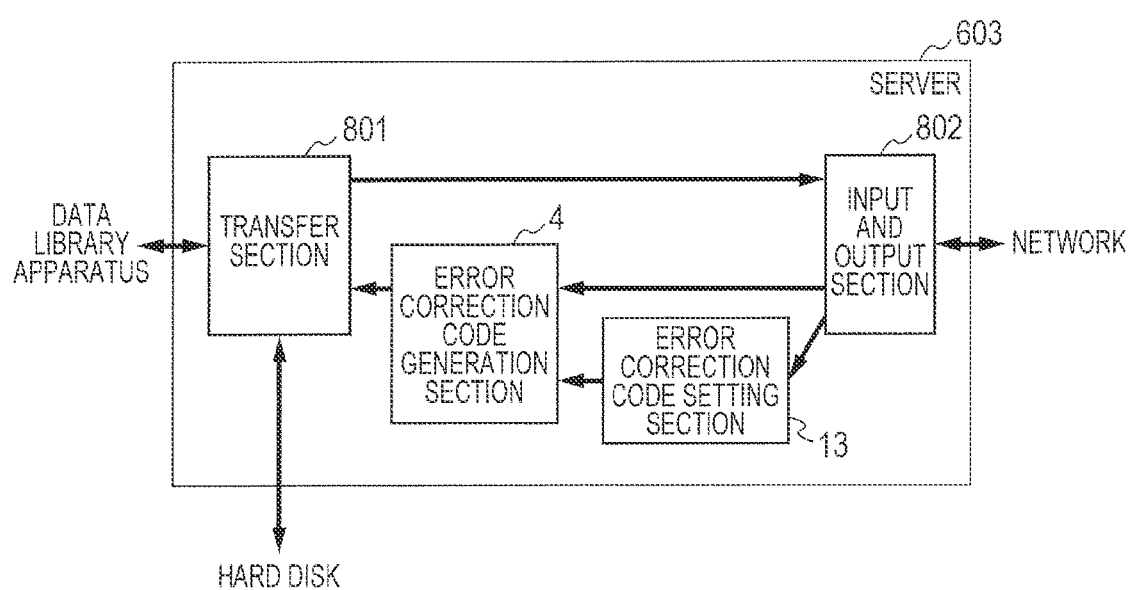
FIG. 8 is a block diagram illustrating an example of a configuration of a server according to the third embodiment.

FIG. 8 is a block diagram illustrating an example of a configuration of the server 603 according to the third embodiment. A transfer section 801 transfers the data storage command, the data fetch command and data concerned to the data library apparatus 601 and the hard disk 605. When the data storage command is to be transferred to the data library apparatus 601, the transfer section 801 also transfers data to be stored, the error correction code data on the data to be stored and the error correction code setting information together with the data storage command.

Owing to provision of the data recording and reproducing apparatus so configured according to the third embodiment, the error correction code data and the error correction code setting information are recorded on each single optical disc, not recording them striding over the plurality of optical discs. Thus, high reliability is attained by performing additional error correction with an additional error correction code using the single disc in error correction without requiring new circuits, while realizing large capacity and parallel recording and reproduction control by storing the plurality of optical discs 609 and including the plurality of drives 610.

Although in the foregoing example, the data library apparatus 601 includes the plurality of drives 610, when the recording and reproduction speeds of the single drive are fast enough for data recording and reproduction, only the single drive 610 may be included.

Although in the forgoing example, the error correction code data and the error correction code setting information are recorded on the single optical disc each time such that error correction is allowed by the single optical disc, the error correction code data and the error correction code setting information may be recorded striding over the plurality of optical discs in order to handle the optical discs such that the plurality of optical discs are grouped into one set.

Incidentally, the present invention is not limited to the above-mentioned embodiments and includes various modified examples. For example, the above-mentioned embodiments have been described in detail in order to simply explain the present invention and are not necessarily limited to those including all the above-mentioned configurations. In addition, a part of the configuration of one embodiment may be replaced with the configuration of another embodiment and addition of the configuration of another embodiment to the configuration of one embodiment is possible. In addition, another configuration may be added to, deleted from and replaced with a part of the configuration of each embodiment.

In addition, the above-mentioned respective configurations, functions, processing units, processing devices and others may be implemented by hardware by designing a part or all of them, for example, by an integrated circuit or circuits. In addition, the above-mentioned respective configurations, functions and others may be implemented by software by interpreting and executing programs for implementing the respective functions by a processor. Information on programs, tables, files and others for implementing the respective functions may be held in recording devices such as a memory, a hard disk, an SSD (Solid State Drive) and others, or in recording media such as an IC card, an SD card and others.

In addition, only control lines and information lines which are regarded to be desirable for explanation are shown and all control lines and information lines are not necessarily illustrated for the convenience of the product. It may be rather regarded that almost all the configurations are connected with one another in reality.

While we have shown and described several embodiments in accordance with out invention, it should be understood that disclosed embodiments are susceptible of changes and modifications without departing from the scope of the invention. Therefore, we do not intend to be bound by the details shown and described herein but intend to cover all such changes and modifications that fall within the ambit of the appended claims.

What is claimed is:

1. An archive system comprising:
a data library apparatus; and
a server;
wherein the data library apparatus is configured to:
   record information on a plurality of optical discs;
   reproduce information from the plurality of optical discs; and
   communicate with the server, connected with a host computer over a network;
wherein the server comprises:
   an input and output section, configured to input user data from the host computer and output data to the host computer over the network;
   a first error correction code generation section, configured to generate a first error correction code from the user data input through said input and output section; and
   a transfer section, configured to transmit the user data and the first error correction code to the data library apparatus; and
wherein the data library apparatus comprises:
   a drive, configured to read data out of and into the optical discs;
   an optical disc storage device, configured to store the plurality of optical discs;
   an optical disc carrier device, configured to carry the optical disc between the optical disc storage device and the drive;
   a receiving section, configured to receive the user data and the first error correction code from the server connected;
   a second error correction code generation section, configured to generate a second error correction code from the user data and the first error correction code that the receiving section has received;
   a recording section, configured to record the user data, the first error correction code and the second error correction code on the optical disc;
   a reproducing section, configured to reproduce the user data, the first error correction code and the second error correction code from the optical disc;
   a first error correction section, configured to correct the error in the user data based upon the first error correction code; and
   a second error correction section, configured to correct errors in the user data and the first error correction code based upon the second error correction code.

2. The archive system according to claim 1, wherein a coding rate of the first error correction code differs in accordance with a radial position on an optical disc on which data to be recorded is recorded.

3. The archive system according to claim 1, wherein a coding rate of the first error correction code differs in accordance with an operating time of the data library apparatus.

4. The archive system according to claim 1, wherein a coding rate of the first error correction code differs in accordance with a radial position on an optical disc on which data to be recorded is recorded and an operating time of the data library apparatus.

5. The archive system according to claim 1, wherein the second error correction section is further configured to:
   correct errors based upon the second correction code in a cluster unit;
   append the first correction code to the user data for every predetermined unit, wherein the predetermined unit corresponds to an integral multiple of the cluster size; and
   pad the user data with specific data to a predetermined data size.

6. The archive system according to claim 1, wherein the second error correction section corrects error on the basis of the second error correction code in a cluster unit;
   the first correction code is appended to the user data for every predetermined unit corresponding to integer multiples of the cluster size;
   the first error correction section corrects the error on a portion of data in the predetermined unit according to the data error position of the predetermined unit.

* * * * *